United States Patent
Mukherjee et al.

(10) Patent No.: US 7,383,168 B2
(45) Date of Patent: Jun. 3, 2008

(54) METHOD AND SYSTEM FOR DESIGN VERIFICATION AND DEBUGGING OF A COMPLEX COMPUTING SYSTEM

(75) Inventors: Rajarshi Mukherjee, San Jose, CA (US); Toshiya Mima, Kanagawa (JP); Yozo Nakayama, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 878 days.

(21) Appl. No.: 10/337,559

(22) Filed: Jan. 6, 2003

(65) Prior Publication Data
US 2004/0133409 A1 Jul. 8, 2004

(51) Int. Cl.
*G06F 9/45* (2006.01)

(52) U.S. Cl. .................. 703/22; 711/147; 711/135; 711/141; 703/13; 704/275

(58) Field of Classification Search .................. 703/22, 703/13, 21; 711/147, 141, 135; 704/275; 714/42, 718; 716/4, 1; 398/182; 709/235, 709/208; 712/208; 370/252; 710/305; 435/4
See application file for complete search history.

(56) References Cited

U.S. PATENT DOCUMENTS

| | | | | |
|---|---|---|---|---|
| 5,740,353 A * | 4/1998 | Kreulen et al. | ............... | 714/42 |
| 5,960,200 A * | 9/1999 | Eager et al. | ................ | 717/147 |
| 5,978,578 A * | 11/1999 | Azarya et al. | ............... | 717/100 |
| 5,987,633 A * | 11/1999 | Newman et al. | ............. | 714/712 |
| 6,411,418 B1 * | 6/2002 | Deri et al. | .................. | 398/182 |
| 6,457,087 B1 * | 9/2002 | Fu | .............................. | 710/305 |
| 6,526,481 B1 * | 2/2003 | Shen et al. | ................. | 711/147 |
| 6,745,294 B1 * | 6/2004 | Wilson et al. | ............... | 711/135 |
| 6,856,950 B1 * | 2/2005 | Abts et al. | ..................... | 703/13 |
| 6,901,055 B1 * | 5/2005 | Hoe et al. | ..................... | 370/252 |
| 7,020,697 B1 * | 3/2006 | Goodman et al. | ........... | 709/223 |
| 2001/0052063 A1 * | 12/2001 | Tremblay et al. | ........... | 712/208 |
| 2002/0032796 A1 * | 3/2002 | Van Loo | ..................... | 709/235 |
| 2002/0042897 A1 * | 4/2002 | Klein et al. | .................. | 714/718 |
| 2002/0152061 A1 * | 10/2002 | Shimogori et al. | ........... | 703/21 |
| 2003/0046356 A1 * | 3/2003 | Alvarez et al. | ............. | 709/208 |
| 2003/0084024 A1 * | 5/2003 | Christensen et al. | ........... | 707/2 |
| 2003/0182641 A1 * | 9/2003 | Yang | ............................. | 716/4 |
| 2003/0208723 A1 * | 11/2003 | Killian et al. | ................... | 716/1 |

(Continued)

OTHER PUBLICATIONS

Acacio et al., "Reducing the latency of L2 misses in shared memory microprocessors through on-chip directory integration", IEEE 2002.*

(Continued)

*Primary Examiner*—K. Thangavelu
(74) *Attorney, Agent, or Firm*—Baker Botts L.L.P.

(57) ABSTRACT

A method and system for element testing is described. A first module is generated and has at least one associated state. A second module is generated based on the first module. The second module is associated with a test element. The test element is controlled based on the second module and the states, and the test element is applied to a design-under-test. Data flow information, determined while applying the test element to the design-under-test, is store in a transaction database, and the data items read and modified by the data flow information are stored in a data database. At least one result is determined based on the application of the test element to the design-under-test.

15 Claims, 3 Drawing Sheets

U.S. PATENT DOCUMENTS

| | | | |
|---|---|---|---|
| 2003/0215786 A1* | 11/2003 | Hill et al. | 435/4 |
| 2004/0031015 A1* | 2/2004 | Ben-Romdhane et al. | 717/107 |
| 2004/0093467 A1* | 5/2004 | Shen et al. | 711/141 |
| 2004/0102978 A1* | 5/2004 | Gygi et al. | 704/275 |
| 2004/0243438 A1* | 12/2004 | Mintz | 705/2 |
| 2004/0249667 A1* | 12/2004 | Oon | 705/2 |

OTHER PUBLICATIONS

Iyer et al., "Design and evaluation of a switch cache architecture for CC-NUMA multiprocessors", IEEE 2000.*

Nilsson et al., "Reducing ownership overhead for load-store sequences in cache-coherent microprocessors", IEEE 2000.*

Puente et al., "A case study of trace-driven simulation for analyzing interconnection networks: CC⁻NUMA with ILP processors", IEEE 2000.*

Byrd et al., "Producer-consumer communication in distributed shared memory multiprocessors", IEEE 1999.*

Iyer et al., "Switch cache: A framework for improving the remote memory access latency of CC-NUMA multiprocessors", IEEE 1999.*

Bhuyan et al., "Impact of switch design on the application performance of cache-coherent multiprocessors", IEEE 1998.*

Qin et al., "Optimizing software cache-coherent cluster architectures", IEEE 1998.*

Hu et al., "Hardware controlled prefetching in directory based cache coherent systems", IEEE 1996.*

Mukherjee, et al., *Verification of an Industrial CC-NUMA Server*, © 2002 *IEEE*, 747-752.

Hu, et al., *Formal Verification of the HAL S1 System Cache Coherence Protocol*, 1997 ICCD pp. 438-444.

Dill, D.L., *The Murɸ Verification System*, Computer Systems Laboratory, Stanford University. (4 pages), 1996 Eighth International Conference on Computer Aided Verification.

Dill, et al., *Protocol Verification as a Hardware Design Aid*, Computer Systems Laboratory, Stanford University. (4 pages), IEEE, 1992.

Kahlouche, et al., *An Industrial Experiment in Automatic Generation of Executable Test Suites for a Cache Coherency Protocol*, 1998 International Workshop on Testing of Communicating Systems. (pp. 1-16).

Ho, et al., *Architecture Validation for Processors*, Computer Systems Laboratory, Sanford University. (10 pages) (Proceedings of the 22nd Annual International Symposium on Computer Architecture, Jun. 1995).

Kuskin, et al., *The Stanford FLASH Multiprocessor*, Computer Systems Laboratory, Stanford University. (12 pages), 1998.

* cited by examiner

METHOD AND SYSTEM FOR DESIGN VERIFICATION AND DEBUGGING OF A COMPLEX COMPUTING SYSTEM

TECHNICAL FIELD OF THE INVENTION

This invention relates in general to design testing, and more specifically, to a method and system for design verification.

BACKGROUND OF THE INVENTION

As computers have grown increasingly important in today's society, the use of powerful, multiprocessor systems has also increased. The multiprocessor systems may provide significant processing power for complex applications. Communication between the various processors and memory elements within a multiprocessor system may be achieved using various techniques.

SUMMARY OF THE INVENTION

According to one embodiment of the present invention, a method and system for element testing is presented. A first module is generated and has at least one associated state. A second module is generated based on the first module. The second module is associated with a test element. The test element is controlled based on the second module and the states and the test element is applied to a design-under-test. At least one result is determined based on the application of the test element to the design-under-test.

The present invention provides various technical advantages. Various embodiments of the present invention may provide all, some or none of these technical advantages. One such technical advantage is the capability to support the use of multiple test environment software from different vendors from a single set of existing test software. By generating testing software, which may involve generating a logical model of the element being tested, in a programming language that is independent of the testing environment being used, the ability to reuse the testing software with different testing environments is supported. Another such technical advantage is the capability to control the test environment software using state machines written in a higher-level language. The use of state machines allows for increased productivity and the use of the higher-level language allows abstraction of implementation details associated with the test environment software. A further technical advantage may be capability to predict an expected status for the element being tested and comparing the expected status to a simulated status to detect errors.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE DRAWINGS

Figure 1:
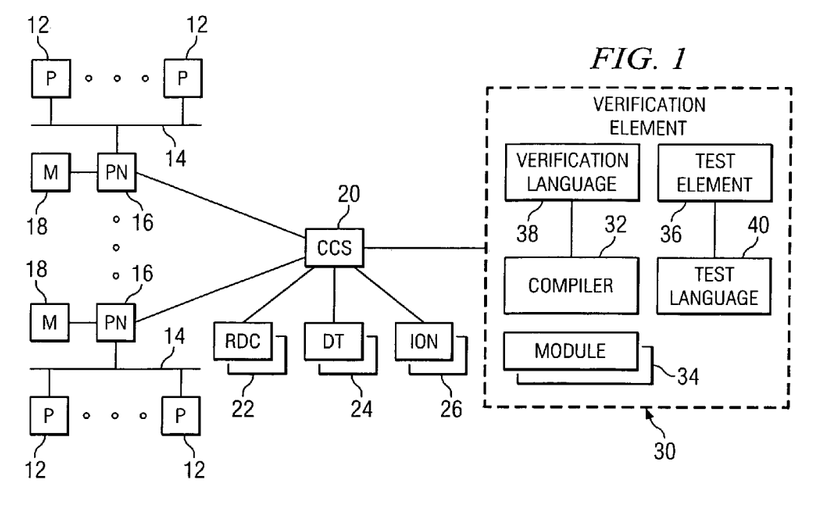
FIG. 1 is a block diagram illustrating a cache-coherent memory system according to one embodiment of the present invention.

FIG. 1 is a block diagram illustrating a cache-coherent memory system 10. System 10 comprises a multiprocessor system using a cache-coherent memory strategy, such as a cache coherent-nonuniform memory access (CC-NUMA) system. A CC-NUMA system comprises a multiprocessor system based around a distributed memory architecture. More specifically, the main memory of the CC-NUMA system is distributed among groups of processors. For example, in a CC-NUMA system with five processor groups, the total memory of the system may be split into five generally equally sized portions and the portions respectively associated with the processor groups. The latency to access data available in the memory associated with the processor is generally lower than the latency to access data in memory associated with a different group of processors, thus the memory access times may be non-uniform. System 10 may further include the capability to determine whether the implementation of the distributed memory access technique is correct. System 10 comprises one or more processors 12, one or more front side buses 14, one or more nodes 16, one or more memories 18, one or more cache-coherent switch (CCS) 20, one or more remote data caches (RDC) 22, one or more directory tags 24, one or more input/output (I/O) nodes (IONs) 26 and a verification element 30.

Processors 12 comprise suitable electronic and/or other data processors in suitable combination operable to execute instructions. For example, logic, such as a computer program, may be stored in memories 18 and be executed by processors 12. In one embodiment, processors 12 comprise Intel Pentium4™ processors.

Front side buses 14 comprise suitable data communications systems operable to communicate data and instructions between processors 12 and memory 18 associated with a particular node 16. For example, front side bus 14 may comprise a front side bus operable to communicate data between processor 12 and memory 18.

Node 16 comprises one or more processors 12 sharing a particular memory 18. More specifically, node 16 comprises suitable data interconnections operable to allow processors 12 to share a particular memory 18.

Memory 18 may comprise electronic, magnetic, optical and/or other suitable data storage operable to communicate with processors 12. In one embodiment, memory 18 comprises physical electronic memory, such as random access memory (RAM), accessible by processors 12 through node 16 to store and retrieve data, such as computer software. Memory 18 is further accessible by remote nodes 16 through CCS 20.

CCS 20 comprises hardware and/or software in suitable combination, such as logic encoded on a computer readable medium, operable to manage data distributed among memories 18. CCS 20 is responsible for managing access to data in particular memories 18 by processors 12. As system 10 may use a distributed memory architecture, data desired by a particular processor 12 may not be available in the memory 18 local to node 16 associated with the particular processor 12 and CCS 20 operates to handle the communication of data from memories 18 to processors 12 at remote nodes 16. In one embodiment, CCS 20 comprises software and/or hardware in suitable combination operable to manage communication between nodes 16 and support a non-uniform memory access latency for accessing memories 18 distributed across system 10.

Remote data caches 22 comprise electronic, magnetic, optical and/or other suitable memories operable to be accessed by CCS 20. More specifically, RDCs 22 may cache data recently communicated from one node 16 to another node 16 by CCS 20. For example, RDCs 22 may cache data to decrease the latency associated with communicating data between nodes 16. In one embodiment, RDCs 22 comprise lower speed memory than the memory used for memory 18. This can be justified since RDCs 22 may provide speedup of access to otherwise remote data maintained in remote memories 18. For example, while access to RDC 22 may be slower than access to local memory 18, the access to RDC 22 may be faster than access to remote memories 18 due to the transactions with CCS 20. However, memory of any suitable types may be used to achieve desired relative speeds between RDCs 22 and memories 18.

Directory tags 24 comprise data associated with the status of portions of memory 18. More specifically, as processors 12 update data in memory 18, directory tags 24 may indicate that the updated data has been changed and which memory 18 holds the changed data.

IONs 26 comprise interfaces operable to communicate with external and/or internal devices. For example, ION 26 may comprise a disk interface for accessing a hard drive.

Verification element 30 comprises software and/or hardware in suitable combination, such as logic encoded on a computer readable medium, operable to test the operation of system 10. In one embodiment, verification element 30 comprises a compiler 32 operable to generate one or more modules 34 for use by a test element 36. Compiler 32 is associated with a verification language 38 while test element 36 is associated with a test language 40.

Compiler 32 comprises software and/or hardware in suitable combination, such as logic encoded on a computer readable medium, to generate modules 34 from verification language 38. For example, compiler 32 may be used to translate from verification language 38 to one or more test languages 40.

In one embodiment, compiler 32 may further provide the capability to generate a graph of accessed data and variables during use of test element 36. The graph may be used by compiler 32 to determine critical section data and generate appropriate modules 34 and/or portions of module 34 to correctly handle shared access to the critical sections. For example, when modules 34 are executing generally in parallel on test element 36, certain data may be shared between modules 34. Improper access to the shared data may generate race-condition type errors and other errors in the testing of system 10. Compiler 32 may automatically detect areas with of potential shared data access issues and generate appropriate access control code to prevent race-conditions and other shared data errors. Also, in one embodiment, compiler 32 may support incremental compilation of new modules 34 based on a compiler generated inter-module dependency analysis.

Modules 34 comprise software and/or hardware in suitable combination, such as logic encoded on a computer readable medium, operable to test system 10 and/or elements such as CCS 20. For example, software may be written in verification language 38 to test proper handling of data requests from processors 12 to remote memories 18. In one embodiment, modules 34 comprise state machines for testing the operation of system 10, including the interaction of CCS 20 with other elements of system 10. Modules 34 may be executed in parallel as appropriate. Modules 34 are described in greater detail in association with FIG. 2.

Test element 36 comprises software and/or hardware in suitable combination, such as logic encoded on a computer readable medium, operable to support testing of CCS 20 and other elements of system 10. In one embodiment, test element 36 comprises test bench and simulation software capable of communicating with CCS 20. Test element 36 may further be operable to simulate and/or monitor the operation of nodes 16 and their associated memory 18 and processors 12. For example, a CCS 20 to be tested may be connected to test element 36 and test element 36 may simulate communications from nodes 16 to CCS 20 to support testing of CCS 20 under controlled conditions. In one embodiment, test element 36 comprises the "e" test bench software from Verisity.

Verification language 38 comprises a programming language usable by compiler 32 to generate modules 34 in test language 40. For example, verification language 38 may allow a user to write applications in a higher-level language than test language 40. Further, verification language 38 may be usable with multiple test elements 36. Test elements 36 often use unique and/or proprietary test languages 40 for controlling the test element 36. Thus, switching from a test element 36 provided by one vendor to a test element 36 from another vendor may involve the rewriting of significant amounts of code, such as for an existing product tested using the original test element 36. As verification language 38 may be usable by compiler 32 to generate different test languages 40, use of verification language 38 and compiler 32 may allow a test program written in verification language 38 to be reused even when test language 40 and test element 36 are changed. In one embodiment, verification language 38 supports various data types including scalar types, such as integer and Boolean, enumerated types, aggregate data types, such as the C-style struct, and list types.

Verification language 38, in one embodiment, may be based on syntax similar to that of the Verilog language so as to be more easily used by personnel testing system 10. Further, use of verification language 38 may provide productivity advantages to the user if the user switches from one test element to a different test element by allowing reuse of modules 34 created in verification language 38 by compiling to a new language used by the different test element instead of rewriting module 34 from scratch in the new test language.

Also, verification language 38 may be designed, in one embodiment, such that implementation details associated with use of test element 36 and test language 40 are abstracted from the user. For example, the architecture of the specification in terms of data structures, methods, classes and tasks, and how to activate the parallel threads may be abstracted from the user. Also, the interface between test element 36 and the RTL used by CCS 20, the handling of events, handling of critical section access and the underlying data structures themselves may be abstracted from the user by verification language 38. In addition, verification language 38 may provide implicit rules of data persistence across one or more states associated with modules 34 and reduce the level of detail associated with implementing the states. The use of abstraction may support an increased level of productivity by the user and a decreased number of errors.

Test language 40 comprises a programming language used by test element 36 to test CCS 20 and other elements of system 10. More specifically, test language 40 provides a user the capability to customize the simulation and testing to be performed on system 10 as desired by the user. Test language 40 may allow the user to define physical elements to be simulated, such as nodes 16, processors 12 and memories 18, elements to be monitored, such as communications between CCS 20 and nodes 16, and tests to be performed, such as injecting errors into CCS 20 to determine the response of CCS 20.

In operation, each element of system 10, such as CCS 20, may be a relatively complex combination of software and/or hardware. Thus, for example, creating a new CCS 20 or upgrading an existing CCS 20 often involves significant verification efforts to determine that CCS 20 operates correctly. One technique for verification of elements involves using test element 36 to simulate portions of system 10 and monitor communications between the elements of system 10. For example, an actual node 16 may be coupled to CCS 20 and test element 36 may monitor communications between node 16 and CCS 20 to determine whether errors are occurring. Test element 36 may also be used to provide input to CCS 20 to test for specific situations, such as corrupt data being received by CCS 20.

Users may generate suitable modules 34 to test other elements of system 10 using verification language 38. Compiler 32 then generates modules 34 in test language 40 from verification language 38 for use by test element 36. For example, compiler 32 may check modules 34 for syntactical and semantic correctness. If test element 36 is changed, modules 34 may be reused by recompiling module 34 written in verification language 38 into a different test language 40. For example, the user may select one or more test languages 40 to use when compiling modules 34.

In one embodiment, a graphical user interface (GUI) may be used to assist the user with verification element 30. For example, a project management screen, a module generation screen and a state generation screen may be provided to assist the user in more efficiently creating test programs, modules and states.

Figure 2:
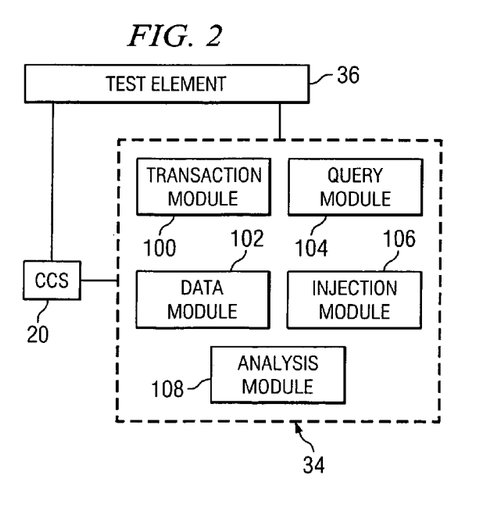
FIG. 2 is a block diagram illustrating a plurality of modules associated with testing of the system according to one embodiment of the present invention.

FIG. 2 is a block diagram illustrating further details of modules 34 according to one embodiment of the present invention. In the illustrated embodiment, the elements are arranged to provide for testing of CCS 20. Thus, the following description details this operation. However, as previously discussed, the disclosed concepts may be used for testing of any appropriate logic design. In one embodiment, modules 34 may comprise a name, one or more data types used inside module 34, a definition of persistent storage for module 34, a set of sensitivities of the module, a set of states of the module, a set of functions used in the module, a start-up function and a wrap-up function. Each module 34 may be seen as an independent thread that activates when something in the module's sensitivity list changes. Module 34 then executes the actions corresponding to the state that module 34 was in when module 34 was last executed. As used herein, each means every one of at least a subset of the available items.

The data types may be recursively defined in terms of standard data-types. For example, a "frames" type may be a list of "frame" types and the "frame" type may be a list of integers. In general, the data types represent the types of data that may be represented and/or used by modules 34.

The storage may be defined in terms of available data-types. For example, a hard drive may be defined as a list of certain aggregate data types. In general, a storage device such as a hard drive includes a number of various components, such as storage elements, controlling systems, mechanical components, a power supply, and other appropriate elements. However, modeling a storage device with available data-types enables modeling of the storage aspects of the device.

Each sensitivity in the set of sensitivities may be specified as follows:

```
Sensitivity {
    Top.clk; // indicates a sensitivity to a change
    // in this signal in the register
                // transfer language (RTL) used by CCS // 20.
}
Sensitivity {
    Top.moduleA.sig(pos);//indicates a sensitivity
            // to a negative transition
            // of this signal in RTL in // module A
}
Sensitivity {
    Top.moduleA.sig(neg); // indicates a sensitivity
            // to a positive transition
            // of this signal in RTL in
            // module A
}
Sensitivity {
    Top.clk && Top.moduleA.sig(pos);
    // indicates a sensitivity to the conjunction of
    // these two conditions in RTL
}
Sensitivity {
    ModuleB.sig22(ver:pos);
    // indicates a sensitivity to the signal named
    // sig22 in ModuleB of test element 36 and NOT in
    // the RTL
}
```

Each state may comprise a name, a reset state flag, one or more transition rules, one or more storage elements, one or more actions, a coverage element, and one or more output elements. The name comprises a unique name associated with the state within module 34. The name may be reused within different modules 34. The reset state flag indicates that the associated state is the initial state for state module 34 when state module 34 is reset to an initial condition.

The transition rules indicate which state to switch to based on received input. For example, a first state may transition to a second state if an error condition is detected and transition to a third state if the correct input is received.

The storage elements indicate locations where data may be stored. For example, transaction data may be stored in a first location while error data is stored in a second location. For another example, the storage element may indicate the name, type, delay and action of the indicated storage element. The delay may indicate that information is not to be stored until a certain time has passed or a particular event occurs. The action indicates the action to be taken by the storage element, such as a function call.

The actions indicate one or more actions to be performed upon entering the state. For example, upon entering a first state in an injection module 106, a particular message may be sent to CCS 20. In general, the actions may comprise any suitable action to be performed by test element 36 with respect to CCS 20 and/or other elements of system 10.

The coverage element comprises a counter that indicates how many times the associated state has been reached. The coverage element may be used to determine if particular test situations have not been reached during a simulation, such as to check that every test case has been performed.

The output elements comprise data to be output to the user upon entering the state. For example, the name of the state may be displayed on a screen when that state is entered so that the user may track the status of module 34. For example, a state may be defined using the following syntax:

```
State {
    Name { }
    Reset { }
    Transition { }
    Storage{
        Name { }
        Type { }
        Delay { }
        // indicating a condition that is to be met
        // before Action is executed
        Action { }
        // Could be a simple assignment or a call to
        // a function
    }
    Storage{ }
    ...
    Action{ }
    // actions on persistent data of the module or
    // actions like injection may be specified
    Action{ }
    ...
    Coverage{ }
    // if the body of the coverage function is empty,
    // a coverage counter may be created and
    // incremented, or a function may be called
    Coverage{ }
    ...
    Output{ } // converted to print statements
}
```

For another example, an implementation of a state is as follows:
State: // an example

```
State {
    Name {Si}
    Reset {Yes}
    Transition {
        (a==1 && b==0)?Si:Sk;
        // may be expressed as C-style case
        // statements, or if-then-else statements
    }
    Storage {
        Name {a}
        Type {int}
        Delay {top.module2.sig2(pos);}
        // wait for positive edge on this RTL signal
        Action {
            a = top.module2.sig44;
            // may call a function that encapsulates
            // more complex action
        }
        Storage {
            Name{ }
            Type{ }
            Delay{ }
            Action{ }
        }
        ....
}
```

For yet another example, a module definition may be as follows:

```
Module {
    Name { } // name of this module
    Typedef{ } // data types
    Typedef{ } // data types
    ...
    Storage{ } // persistent storage for this module
    Storage{ } // persistent storage for this module
    ...
    Sensitivity{ }
    // signals and events that cause this module to
    // execute Sensitivity{ } signals and events that cause
    // this module to execute
    ...
    Function{ } // functions used in this module
    Function{ } // functions used in this module
    ...
    State{ } // states of this module
    State{ } // states of this module
    ...
    Sfunction{ }
    // function may be called immediately after simulation
    // starts. For example, to perform appropriate setup // activities.
    Wfunction{ }
    // function may be called immediately before
    // simulation ends. For example, to perform
    // appropriate cleanup activities.
}
```

Module 34 may further comprise various types of modules, such as a transaction module 100, a data module 102, a query module 104, an injection module 106 and an analysis module 108. A user testing CCS 20 may generate zero, one or more of the various module types. For example, many transaction type modules may be created while only a few analysis type modules are created and no query type modules are created for a particular CCS 20.

Transaction module 100 comprises storage and logic for monitoring and analyzing data flows within system 10. In one embodiment, transactions in system 10 are monitored by transaction module 100 and store the transaction identifier, the contents of the transaction, and timing information associated with the transaction, such as start time, end time and time of messages associated with the transaction. In general, transaction modules 100 represent test software for monitoring the various transactions, which may each comprise a plurality of messages communicated between elements of system 10, and store appropriate data based on the transactions.

Data module 102 comprises test software operable to track and store changes to various data items monitored by test element 36. For example, data type modules may be used to monitor data in memories 18 for proper updating and communication. In one embodiment, data modules 102 store the history of modification to data in memories 18 and RDC 22, the source of the modification, such as which processor 12 and/or node 16 requested the change, and time of the modification.

Query module 104 comprises test software operable to generate queries to test element 36. More specifically, as test element 36 tests CCS 20, query module software may detect particular occurrences, such as certain data being in certain places, and query test element 36 as to various details about the status of the simulation and testing. For example, a test for RDC 22 operation may be constructed such that an injection module 106 inserts particular data into a particular memory location while query module 104 monitors for that particular data and a certain message sent from CCS 20 to memory 18. When query module 104 detects the data and the message, the state of RDC 22 may be queried from test element 36 and stored for later analysis. In one embodiment, query modules 104 monitor data stored by data modules 102 and information in tag directory 24 for particular conditions and query test element 36 based on the particular conditions.

Injection modules 106 comprise test software operable to monitor the status of test element 36 and generate particular inputs to test element 36. More specifically, injection modules 106 may be used to insert test data to test specific situations with respect to CCS 20. For example, if a remote node 16 desires access to data in RDC 22, first the data is flushed from RDC 22 before ownership is granted to the remote node 16. Injection modules 106 may insert test data to determine whether elements of system 10, such as CCS 20, correctly handle the situation.

Analysis modules 108 comprise test software operable to analyze data collected by modules 34. In one embodiment, data communicated between elements of system 10, transaction and message identifiers, stored data, data history, relationships between data and latency information are analyzed by analysis modules 108 as appropriate for CCS 20. In general, verifying the operation of CCS 20 and system 10 may involve various evaluations of data and results collected by other modules 34. Analysis modules 108 may perform these evaluations and communicate results to users for use in debugging CCS 20.

In operation, users create various modules 34 to perform various tests on CCS 20 and system 10. Modules 34 are coded using verification language 38 and compiled into test language 40 for use by test element 36. These modules 34 may be used to find bugs and other errors in system 10, and determine if attempts to fix the bugs and errors have been successful.

Figure 3:
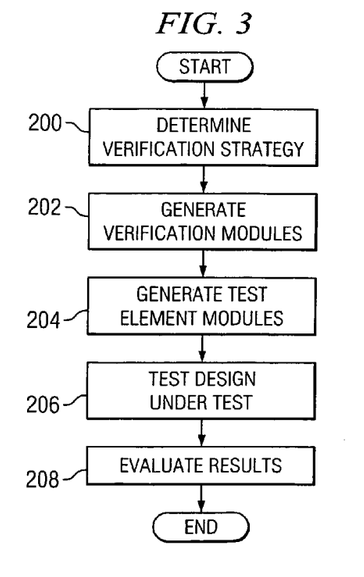
FIG. 3 is a flowchart illustrating a method for testing the system and other elements of the system according to one embodiment of the present invention.

FIG. 3 is a flowchart illustrating a method for testing CCS 20 and other elements of system 10 according to one embodiment of the present invention. The method begins at step 200 where a user determines a verification strategy for CCS 20 and/or other elements of system 10. For example, the user may determine that particular functionality of CCS 20 that has changed is to be tested for proper operation. In one embodiment, determining the verification strategy also comprises selecting test element 36 for testing system 10. In general, the verification strategy represents an overall plan for testing of system 10.

Next, at step 202, one or more modules 34 are generated for use with CCS 20 and/or other elements of system 10. Modules 34 may be generated to implement various portions of the verification strategy, such as testing particular elements of CCS 20. The user generating modules 34 may use verification language 38.

Then, at step 204, compiler 32 generates modules 34 in test language 40 based on test element 36, such as test element 36 selected in step 200. More specifically, compiler 32 takes modules 34 as written in verification language 38 and generates test language 40 versions of modules 34 for use with test element 36.

Proceeding to step 206, test element 36 uses modules 34 to test CCS 20 and/or other elements of system 10. For example, test element 36 may simulate various elements of system 10 while using modules 34 to test the operation of CCS 20 with respect to the other elements of system 10. In general, one or more suitable tests may be performed on CCS 20 to determine whether CCS 20 is properly operating so that errors in CCS 20 may be fixed.

Next, at step 208, results from the tests may be evaluated. For example, analysis modules 108 may be used to analyze results in data module 102. For another example, the user may analyze results generated by modules 34. Based on the evaluation, further testing may be performed and corrections made. In general, suitable evaluations may be performed based on the tests of step 206 and appropriate action taken, such as corrections and further testing.

Figure 4:
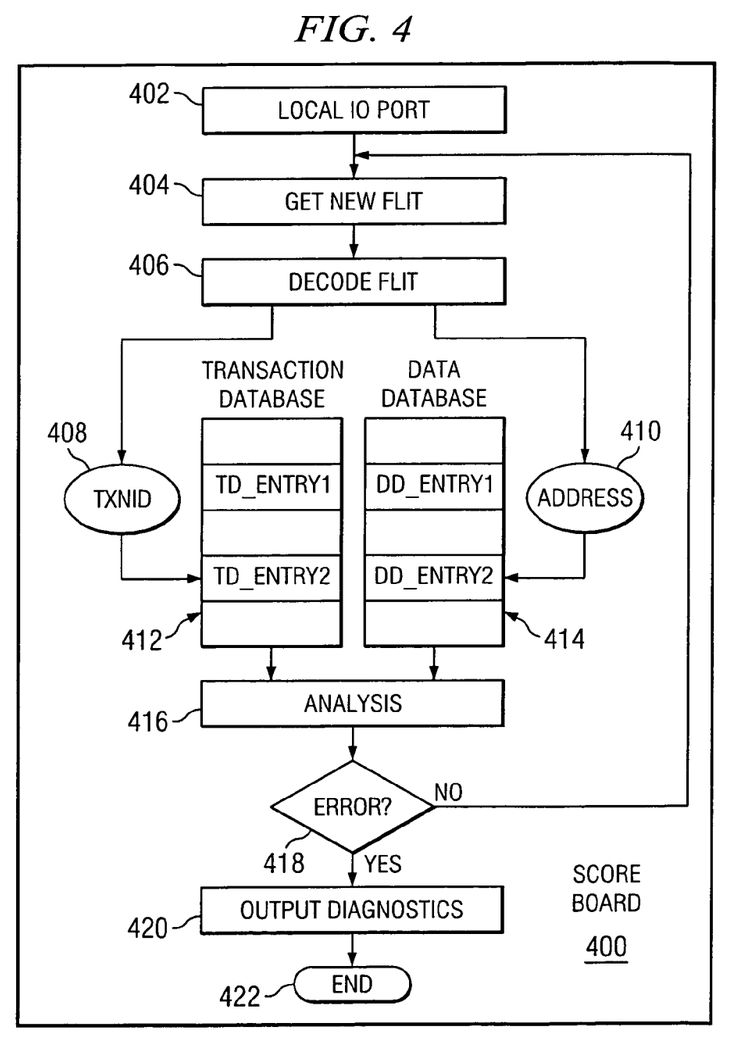
FIG. 4 is a flow diagram illustrating a method of operation of a scoreboard associated with testing of the system according to one embodiment of the present invention.

FIG. 4 is a flow diagram illustrating a method of operation of a scoreboard 400 according to one embodiment of the present invention. Scoreboard 400 comprises a module 34 operable to watch, analyze and generate output associated with CCS 20. Scoreboard 400 may operate at a protocol layer, a link layer, and/or a physical layer. In the disclosed embodiment, the protocol layer is described and may allow the scoreboard to monitor and detect errors associated with the design under test at a relatively high level. Using the protocol layer may also reduce the complexity of the scoreboard and increase robustness. Further, catching and reporting errors at the protocol layer may increase the ease of fixing the errors. Scoreboard 400 may monitor processor nodes 16, memory 18, CSS 20 and/or IONs 26, either alone or in suitable combination. In the disclosed embodiment, communications with CCS 20 are monitored. In general, scoreboard 400 may operate to predict the expected status of CCS 20 in response to messages and/or transactions for comparison against the actual status of CCS 20 in order to detect errors.

Scoreboard 400 may operate to verify correctness of cacheline data, verify correctness of a cacheline state, verify that transactions have all protocol level messages in the correct order and verify that no transaction has spurious messages for coherent transactions. Scoreboard 400 may further operate to verify the mutual orderings of non-coherent writes to memory for non-coherent transactions.

A full-scale implementation of the cache coherent protocol may work well as scoreboard 400, however, implementation of such a model may require significant effort. Also, due to the complexity, the scoreboard itself would be susceptible to errors. In one embodiment, the cache coherence protocol may be abstracted to decrease the number of message types to be monitored and decrease the complexity of the implementation of scoreboard 400, however, design details associated with the design under test may be retained.

The method begins at step 402, where scoreboard 400 observes a new flit on one or more local I/O ports (LIOPs) associated with CCS 20. More specifically, the LIOPs comprise the physical and/or logical data I/O locations associated with CCS 20. For example, LIOPs may comprise pins, data lines, memory lines, address lines and/or other suitable logical and/or physical I/O ports, in suitable combination, associated with CCS 20. In one embodiment, a flit may comprise a message or a portion of a message communicated between CCS 20 and another element of system 10. Alternatively, a flit may comprise any suitable data communicated between CCS 20 and another element of system 10. Next, at step 404, scoreboard 400 stops the simulation and retrieves the new flit. Then, at step 406, the new flit is decoded into a transaction identifier 408 and an address 410. Transaction identifier 408 and address 410 are then analyzed to detect errors and one or more internal data structures associated with scoreboard 400 are updated with the new information. Next, at step 412, transaction identifier 408 may be entered into a transaction database, such as a transaction database maintained by transaction module 100. More specifically, when the first message in a new transaction is observed at CCS 20, a new Transaction Storage Entry is created in the transaction database. Each transaction in the system has a unique transaction identifier 408. Transaction identifier is used to uniquely identify the corresponding Transaction Storage Entry. The Transaction Storage Entry is deallocated when the transaction finishes.

Figure 5:
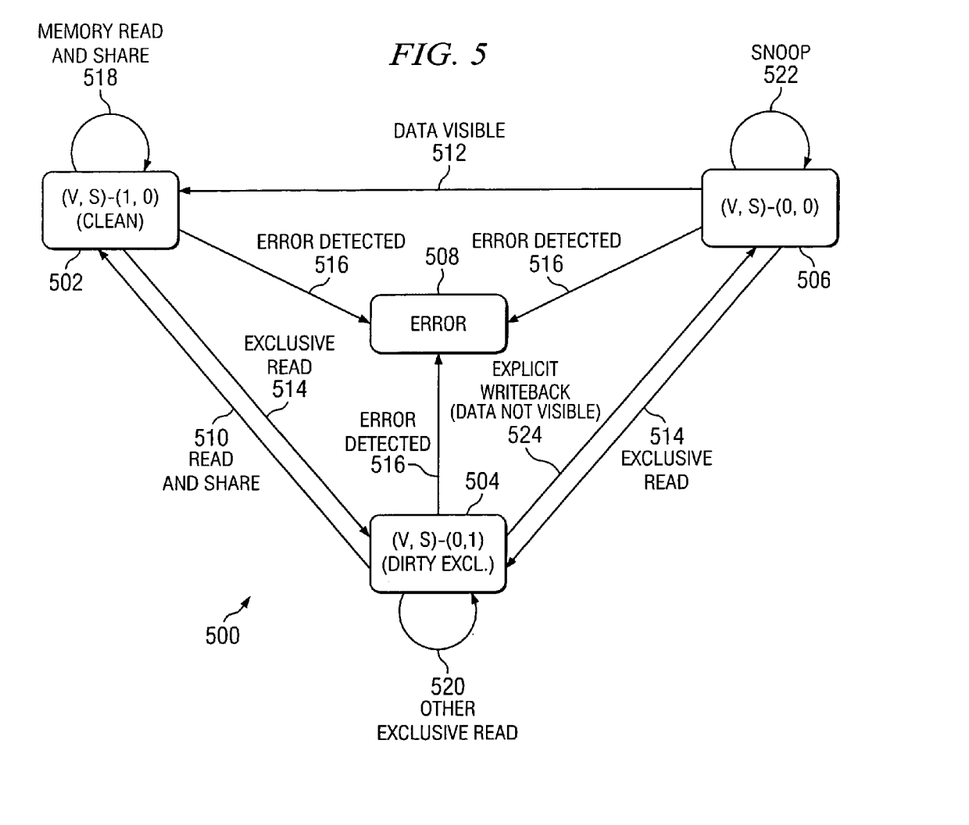
FIG. 5 is a diagram illustrating a state machine associated with the scoreboard according to one embodiment of the present invention.

At step 414, address 410 may be entered into a data database, such as a data database maintained by data module 102. More specifically, a Data Storage Entry in the data database is created for each unique cacheline in memory 18 which is accessed during simulation. The data database stores the correct data and state of each cacheline. Each Data Storage Entry is associated with two flags, a V flag which is TRUE when the data stored in the Data Storage Entry is valid, and an S flag which is TRUE if the main memory entry for this cacheline has invalid data. FIG. 5 illustrates further details associated with the state transitions, and V and S flags of the Data Storage Entries. Each Data Storage Entry may function as a repository for the correct predicted data and caching state of the corresponding cacheline.

Proceeding to step 416, analysis module 108 may analyze transaction identifier 408, address 410, and/or related entries in the transaction and/or data databases. Then, at decisional step 418, analysis module 108 determines whether an error has occurred. More specifically, analysis module 108 identifies a transaction by observing the messages associated with the transaction, and determining the new data and new state of the cacheline involved. Errors in the data and state of a cacheline may be detected by comparing the data and state observed in the system with an expected data and expected state computed by scoreboard 400. Since scoreboard 400 may observe and identify each transaction, scoreboard 400 may detect an incomplete transaction, such as a transaction for which all messages have not been observed, and an illegal transaction, such as a transaction which includes a spurious or incorrect message. Once an error is detected, the YES branch of decisional step 418 leads to step 420 where scoreboard 400 stops further simulation and generates diagnostic information to help a user determine the problem. The diagnostic information may include the address of the cacheline involved in the error, the expected data, the actual erroneous data, and a trace of the computation steps that led to the error. If no errors is detected, the NO branch of decisional step 418 leads to step 404 where the next flit is retrieved. Once scoreboard 400 has finished analyzing flits, control is returned to the simulator at step 422.

FIG. 5 is a diagram illustrating a state machine 500 associated with scoreboard 400 according to one embodiment of the present invention. State machine 500 may operate as a portion of analysis module 108 to determine whether an error has occurred. Alternatively, state machine 500 may operate as a portion of scoreboard 400, or as an independent module 34. State machine 500 comprises a clean state 502, a dirty state 504, a message state 506 and an error state 508. State machine 500 further comprises a share transition 510, a visible transition 512, a read transition 514, an error transition 516, a memory transition 518, an other transition 520, a snoop transition 522 and a writeback transition 524.

In operation, state machine 500 begins at clean state 502 where the V flag is true and the S flag is false and indicates that a flit retrieved at step 404 includes correct information and the data in the indicated memory 18 is correct. If an error is detected by analysis module 108, then error transition 516 leads to error state 508. If an exclusive read operation is detected, then read transition 514 leads to dirty state 504. If a memory read and share operation is detected, then memory transition 518 returns to clean state 502 as the V and S flags have not been changed.

At dirty state 504, the V flag is false and the S flag is true, which indicates that an operation has invalidated particular data in memory 18 and data stored in the data storage entry is invalid. If a read and share operation is detected while in dirty state 504, share transition 510 returns to clean state 502. If an explicit writeback operation occurs and the data is not visible, then writeback transition 524 leads to message state 506. If other exclusive read operation is detected, then other transition 520 returns to dirty state 504. If an error is detected while in dirty state 504, then error transition 516 leads to error state 508.

At message state 506, the V flag is false and the S flag is false, which indicates that an operation has caused invalid data to be stored in the data storage entry and that a particular memory 18 has valid data. If a data visible related operation is detected while in message state 506, visible transition 512 leads to clean state 502. If an exclusive read operation is detected, read transition 514 leads to dirty state 504. If a snoop operation occurs then snoop transition 522 leads back to message state 506. If an error is detected, then error transition 516 leads to error state 508.

Although the present invention has been described in several embodiments, a myriad of changes and modifications may be suggested to one skilled in the art, and it is intended that the present invention encompass such changes and modifications as fall within the scope of the present appended claims.

What is claimed is:

1. A method for element testing comprising:
identifying a first module having at least one associated state, the first module implemented using a verification language;
generating a second module based on the first module, the second module implemented using a test language, the test language being a programming language associated with a test element, wherein generating the second module comprises compiling the verification language of the first module into the test language of the second module;
controlling the test element based on the second module and the at least one state associated with the first module;
applying the test element to a design-under-test;
storing data flow information in a transaction database, the data flow information determined while applying the test element to the design-under-test;
storing data items in a data database, the data items read and modified by transactions associated with the data flow information; and
determining at least one result based on the application of the test element to the design-under-test.

2. The method according to claim 1, wherein the test element comprises a test bench system operable to communicate with the design-under-test and simulate at least one memory element.

3. The method according to claim 1, wherein the first module comprises one of a transaction module, a data module, a query module, an injection module, a scoreboard module or an analysis module.

4. The method according to claim 1 and further comprising:
identifying a second test element distinct from the test element and a second test language distinct from the test language, the second test language being a programming language associated with the second test element;

generating a third module based on the first module, the third module implemented using the second test language, wherein generating the third module comprises compiling the verification language of the first module into the second test language of the third module;

controlling the second test element based on the third module and the at least one state associated with the first module;

applying the second test element to the design-under-test;

storing second data flow information in the transaction database, the second data flow information determined while applying the second test element to the design-under-test;

storing second data items in the data database, the second data items read and modified by the second data flow information; and determining at least one further result based on the application of the second test element to the design-under-test.

5. The method according to claim 1, wherein the design-under-test comprises a plurality of processors, a plurality of memories corresponding to the processors, and a cache-coherent switch operable to handle requests for data between each of the processors and the memories corresponding to other ones of the processors.

6. The method according to claim 1, wherein operation of the second module is based on the first module and wherein the state comprises at least one transition rule.

7. The method according to claim 1, wherein applying the test element to the design-under-test comprises:

simulating at least one processor node operable to communicate with a cache-coherent switch within the design-under-test;

monitoring, by the second module, at least one communication between the cache-coherent switch and the processor node; and predicting, by a scoreboard, an expected result based on the at least one communication.

8. A computer program for element testing, the computer program stored on a computer readable storage medium and operable when executed to;

identify a first module having at least one associated state, the first module implemented using a verification language;

generate a second module based on the first module, the second module implemented using a test language, the test language being a programming language associated with a test element, wherein generating the second module comprises compiling the high-level programming language of the first module into the test language of the second module;

control the test element based on the second module and the at least one state associated with the first module;

apply the test element to a design-under-test;

store data flow information in the transaction database, the data flow information determined while applying the test element to the design-under-test;

store data items in the data database, the data items read and modified by transactions associated with the data flow information; and determine at least one result based on the application of the test element to the design-under-test.

9. The computer program of claim 8, wherein the test element comprises a test bench system operable to communicate with the design-under-test and simulate at least one memory element.

10. The computer program of claim 8, wherein the first module comprises one of a transaction module, a data module, a query module, an injection module, a scoreboard module or an analysis module.

11. The computer program of claim 8, wherein the computer program is further operable to:

identify a second test element distinct from the test element and a second test language distinct from the test language, the second test language being a programming language associated with the second test element;

generate a third module based on the first module, the third module implemented using the second test language, wherein generating the third module comprises compiling the verification language of the first module into the second test language of the third module;

control the second test element based on the third module and the at least one state associated with the first module;

apply the second test element to the design-under-test;

store second data flow information in the transaction database, the second data flow information determined while applying the second test element to the design-under-test;

store second data items in the data database, the second data items read and modified by the second data flow information; and determine at least one further result based on the application of the second test element to the design-under-test.

12. The computer program of claim 8, wherein the design-under-test comprises a plurality of processors, a plurality of memories corresponding to the processors, and a cache-coherent switch operable to handle requests for data between each of the processors and the memories corresponding to other ones of the processors.

13. The computer program of claim 8, wherein operation of the second module is based on the first module and wherein the state comprises at least one transition rule.

14. The computer program of claim 8, wherein applying the test element to the design-under-test comprises the computer program further operable to;

simulate at least one processor node operable to communicate with a cache-coherent switch within the design-under-test;

monitor, by the second module, at least one communication between the cache-coherent switch and the processor node; and predict, by a scoreboard module, an expected result based on the at least one communication.

15. A system for element testing comprising:

one or more processor elements and one or more memory elements;

means for identifying a first module having at least one associated state, the first module implemented using a verification language;

means for generating a second module based on the first module, the second module implemented using a test language, the test language being a programming language associated with a test element, wherein generating the second module comprises compiling the verification language of the first module into the test language of the second module;

means for controlling the test element based on the second module and the at least one state associated with the first module;
means for applying the test element to a design-under-test;
means for storing data flow information in a transaction database, the data flow information determined while applying the test element to the design-under-test;

means for storing data items in a data database, the data items read and modified by transactions associated with the data flow information; and
means for determining at least one result based on the application of the test element to the design-under-test.

* * * * *